US012744358B2

(12) United States Patent
Defranza et al.

(10) Patent No.: US 12,744,358 B2
(45) Date of Patent: Sep. 22, 2026

(54) CORROSION RESISTANT HEATSINK METHOD, SYSTEM, AND APPARATUS

(71) Applicant: NLIGHT, INC., Camas, WA (US)

(72) Inventors: Mark J Defranza, Camas, WA (US); Eric Martin, Camas, WA (US)

(73) Assignee: NLIGHT, INC., Camas, WA (US)

( * ) Notice: Subject to any disclaimer, the term of this patent is extended or adjusted under 35 U.S.C. 154(b) by 892 days.

(21) Appl. No.: 17/783,219

(22) PCT Filed: Dec. 22, 2020

(86) PCT No.: PCT/US2020/066730
§ 371 (c)(1),
(2) Date: Jun. 7, 2022

(87) PCT Pub. No.: WO2021/133853
PCT Pub. Date: Jul. 1, 2021

(65) Prior Publication Data

US 2023/0024762 A1 Jan. 26, 2023

Related U.S. Application Data

(60) Provisional application No. 62/953,351, filed on Dec. 24, 2019.

(51) Int. Cl.
*H01S 5/024* (2006.01)
*H01S 5/02208* (2021.01)
*H01S 5/40* (2006.01)

(52) U.S. Cl.
CPC ...... *H01S 5/02476* (2013.01); *H01S 5/02208* (2013.01); *H01S 5/02423* (2013.01); *H01S 5/02469* (2013.01); *H01S 5/4025* (2013.01)

(58) Field of Classification Search
CPC ............. H01S 5/02476; H01S 5/02208; H01S 5/02423; H01S 5/02469; H01S 5/4025
See application file for complete search history.

(56) References Cited

U.S. PATENT DOCUMENTS 4,615,945 A * 10/1986 Iida ........................ H05K 1/053 428/335
6,071,750 A * 6/2000 Silverbrook ......... G06K 7/1417 348/E5.055

(Continued)

FOREIGN PATENT DOCUMENTS

CN 102738377 A 10/2012
CN 103134022 A 6/2013

(Continued)

OTHER PUBLICATIONS

Federal Institute of Industrial Property; International Search Report and Written Opinion PCT/US2020/066730 dated Mar. 4, 2021; 10 Pages.

*Primary Examiner* — Xinning(Tom) Niu
(74) *Attorney, Agent, or Firm* — Wiley Rein LLP

(57) ABSTRACT

A heat source package, comprising a housing having a metal base portion with one or more channels formed therein, the one or more channels having an inner surface, a coating of an anti-corrosive material adhered to a portion of the inner surface of the one or more channels wherein the anti-corrosive material is selected to have a thermal conductivity within a threshold range such that the coating changes the thermal resistance of a coated portion of the channel less than 25% with respect to an uncoated portion of the metal base portion. In examples, a heat source may be thermally coupled to the inner surface of the channels and the channels may be formed to conduct a liquid coolant from a liquid inlet to a liquid outlet to dissipate heat away from the heat source.

17 Claims, 11 Drawing Sheets

(56) References Cited

U.S. PATENT DOCUMENTS

| | | | | |
|---|---|---|---|---|
| 2004/0244947 | A1* | 12/2004 | Chen | F28F 13/06<br>257/E23.099 |
| 2017/0358900 | A1* | 12/2017 | Kanskar | H01S 5/02469 |

FOREIGN PATENT DOCUMENTS

| | | | | |
|---|---|---|---|---|
| CN | 107829089 | A | | 3/2018 |
| CN | 208538833 | U | * | 2/2019 |
| WO | WO 2018/200587 | A1 | | 11/2018 |

* cited by examiner

CORROSION RESISTANT HEATSINK METHOD, SYSTEM, AND APPARATUS

RELATED APPLICATIONS

The present application is a National Phase entry under 35 U.S.C. § 371 of International Application No. PCT/US2020/066730, filed on Dec. 22, 2020, which claims priority to U.S. Provisional Application No. 62/953,351, filed on Dec. 24, 2019, the entire contents of these applications are incorporated herein by reference in their entirety.

TECHNICAL FIELD

The disclosure relates to anti-corrosive coatings applied to heat dissipation devices in laser diode packaging.

BACKGROUND

The use of high-power fiber lasers is increasing in popularity for a variety of commercial and military applications. Optical power can be delivered from a laser source to an application system configured to transmit the optical power to enable the desired laser application. In a typical fiber laser assembly, semiconductor devices generate pump light that is launched into a fiber and emitted from a terminating end of the fiber.

Laser diodes are a type of semiconductor device. They tend to be fragile and typically assembled in a housing to protect the device from damage due to thermal and mechanical stress, corrosion, contamination, etc. Laser diode housings dissipate a significant amount of heat generated by the laser diodes during operation. Therefore, laser diode packaging typically includes heat dissipation components such as heat dissipation layers, heat spreaders and/or heat sinks.

One strategy to enable efficient cooling of these housings is to use embedded water-cooling channels within the laser housing, positioned as close to the laser diode heat load as possible. The water channels act as a mechanism to efficiently remove heat from the housing. Size and weight are important metrics for a laser housing, especially ones that are intended for use by the defense industry. To reduce weight, these housings can be made using aluminum (Al) materials with embedded liquid-cooling channels. For cost reduction reasons, commercial housings would also benefit from the use of Al materials in the housing construction.

One problem with using Al materials in a liquid-cooled laser diode housing is that when exposed to certain coolants, Al will corrode over time and degrade the integrity of the mechanical dimensions and cooling capability of the laser system. What is needed is a method to reduce corrosion of Al surfaces when exposed to liquid-coolant in laser diode housings to enable the use of low weight, low cost Al housings in military and commercial applications.

SUMMARY

A package for dissipating heat from a heat source is disclosed herein, some examples may include: a housing having a metal base portion with one or more channels formed therein, the one or more channels having an inner surface, a coating of an anti-corrosive material adhered to a portion of the inner surface of the one or more channels wherein the anti-corrosive material is selected to have a thermal conductivity within a threshold range such that the coating changes the thermal resistance of a coated portion of the channel less than 25% with respect to an uncoated portion of the metal base portion, and a heat source thermally coupled to the inner surface of the channels, the channels formed to conduct a liquid coolant from a liquid inlet to a liquid outlet to dissipate heat away from the heat source. The package may include a lid formed to couple to the base portion so as to form a liquid tight seal over the one or more channels. In some examples, the metal base portion comprises aluminum (Al) at least in part. In some examples, the anti-corrosive material is a diamond like carbon (DLC) or silicon carbide (SiC). In some examples, the DLCC is adhered to the inner surface by a passivation technique. The heat source may be one or more laser diodes. In some examples, at least one of the one or more laser diodes is disposed on a heatsink comprising thermal dissipation members. In some examples, the heatsink is configured to mate to the base such that the thermal dissipation members extend into at least one of the one or more channels. The members may be coated with an anti-corrosive material. In some examples, the coating is DLC. The DLC may be adhered to the member surface by a passivation technique. The package may include one or more fins disposed in one or more of the channels and the one or more fins may comprise Al. In some examples, the one or more fins are anfractuous. The coating may be adhered to the one or more fins. In some examples, the heat source is one or more laser diode assemblies and the one or more fins may each be thermally coupled through the base portion to the one or more laser diodes. In some examples, the coating is adhered to an inner surface of the lid. The anti-corrosive material is a DLCC or SiC and the liquid coolant may be water. In some examples, the coating is selected to have a thermal conductivity within a threshold range such that the coating changes the thermal resistance of a coated portion of the housing with respect to an un-coated portion within a range of 0%-20%, 0%-10%, 0-5%, 0-2% or 0-1%. In some examples, the coating is selected to have a thermal conductivity within a threshold range such that the coating changes the thermal resistance of a coated portion of the housing with respect to a material the base portion comprises within a range of 0%-20%, 0%-10%, 0-5%, 0-2% or 0-1%. In some examples, the anti-corrosive material is DLC, SiC, $B_4C$, AlN, c-BN, h-BN, $Si_3N_4$, or any combinations thereof.

The foregoing and other objects, features, and advantages will become more apparent from the following detailed description, which proceeds with reference to the accompanying figures which may not be drawn to scale.

BRIEF DESCRIPTION OF THE DRAWINGS

The accompanying drawings, wherein like reference numerals represent like elements, are incorporated in and constitute a part of this specification and, together with the description, explain the advantages and principles of the presently disclosed technology. In the drawings.

DETAILED DESCRIPTION

Figure 1A:
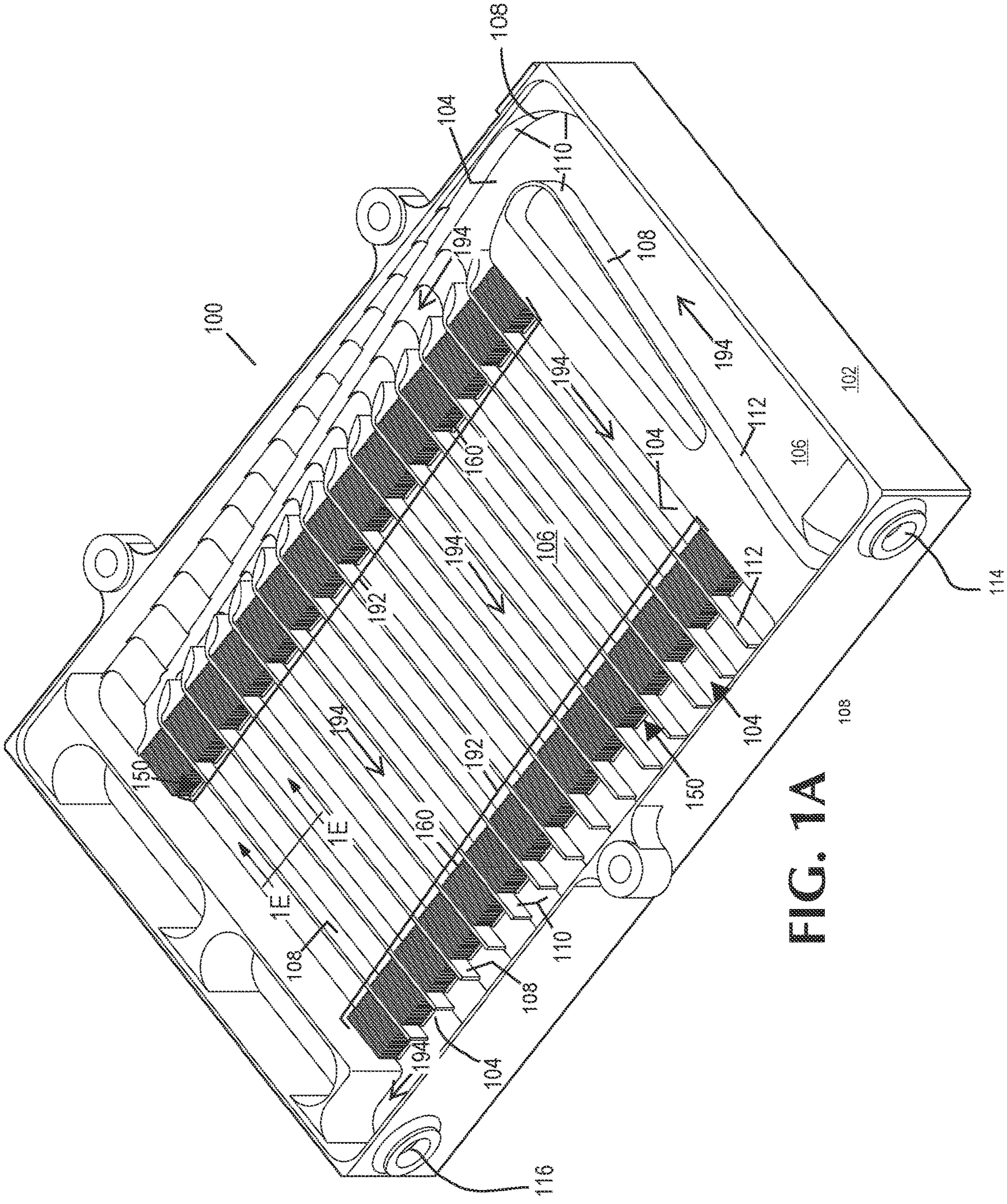
FIG. 1A illustrates a perspective view of an example heat source package comprising a liquid-cooled laser diode housing having embedded cooling channels.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper." "lower," and the like. These terms are used for convenient description, but do not imply any particular spatial orientation.

For the sake of simplicity and readability, in the drawings single elements are labeled. Where there is a plurality of identical elements, representative example elements will be labeled rather than labeling each of the plurality of elements.

As noted above, embedded water-cooling channels are an efficient way to remove heat from a package for cooling a heat source such as a laser diode housing. The use of Al or other conductive, lightweight materials in the housing construction may also reduce size, weight and power consumption. A liquid cooling environment can cause corrosion of liquid cooling channels due to chemical, electro-chemical, or abrasive action. Conventional solutions tend to result in a detrimental reduction in thermal transfer between the heatsink and the liquid. To avoid or reduce corrosive damage without the thermal transfer penalty, a solution is to coat surfaces of channels and metal heatsinks that will come in contact with the liquid coolant using a highly thermally conductive, anti-corrosive material like silicon carbide (SiC), diamond like carbon coatings (DLCC), or the like or any combination thereof. In an example, the thermal conductivity (K) of the coating is in the range of about 5.0-10000.0 W/m-K. The thermal conductivity of the surface coating impacts the thermal resistance for heat transfer through the surface based on the material thickness and area. Based on the surface coating material thickness and geometry, the surface coating can either slightly degrade the overall thermal transfer characteristics of the mechanical structure, or enhance the thermal performance of the system.

FIG. 1A is a perspective view of an example liquid-cooled laser diode housing 100 which is an example of a package for cooling a heat source. Housing 100 includes a base portion 102 having a plurality of embedded channels 104 formed therein. Base portion 102 may be made of a thermally conductive materials such as, Al, copper (Cu), silver (Ag), gold (Au), platinum (Pt), doped silicon (Si), magnesium (Mg), graphite or the like or any combinations thereof. For low size, weight, high-power ("low SWaP") packaging, highly thermally conductive Al may be preferred over higher density materials and can be used to decrease the overall weight of housing 100.

In an example, channels 104 include an inner surface through which a liquid coolant can flow. The inner surface comprises a bottom surface 106 and side wall surfaces 112. Side walls 108 are formed to be perpendicular to bottom surface 106. In other examples, side walls 108 may be formed to make any of a variety of angles with respect to bottom surface 106. Channels 104 conduct liquid coolant in the direction of arrows 194 from inlet 114 to outlet 116. The liquid coolant selected to flow in channels 104 may be any of a variety of liquid coolants known to those of skill in the art, such as, for example, water, water and glycol (e.g., ethylene glycol (EGW), diethylene glycol (DEGW), propylene glycol (PGW), ammonia, 1,1,1,2-tetrafluoroethane, or the like or any combination thereof.

A laser diode array 192 comprising a plurality of laser diodes 150 is disposed in base 102. The laser diodes 150 are thermally coupled to base portion 102. Heat sink fins 160 of laser diodes 150 are positioned to extend into embedded channels 104 to improve thermal coupling of laser diodes 150 with liquid coolant. This layout increases the surface area of heat sources with which the liquid coolant comes into contact.

In an example, bottom surface 106 and side wall surfaces 112 of channels 104 and/or fins 160 are coated ("coated portion(s)") with a highly thermally conductive, anti-corrosive coating 110 to protect the inner surface of channels 104 and fins 160 from corrosion without a significant thermal transfer penalty in that the coating 110 is selected so that the presence of the coating does not change the thermal resistance of a coated portion of the base portion 102 by more than about 25%. For example, percent changes may range from 0%-20%, 0%-10%, 0-5%, 0-2% or 0-1% with lower percent changes being preferred for some examples. Such a coating 110 may even improve heat transfer. Coating 110 is discussed in greater detail in the description of FIG. 1E below.

Figure 1B:
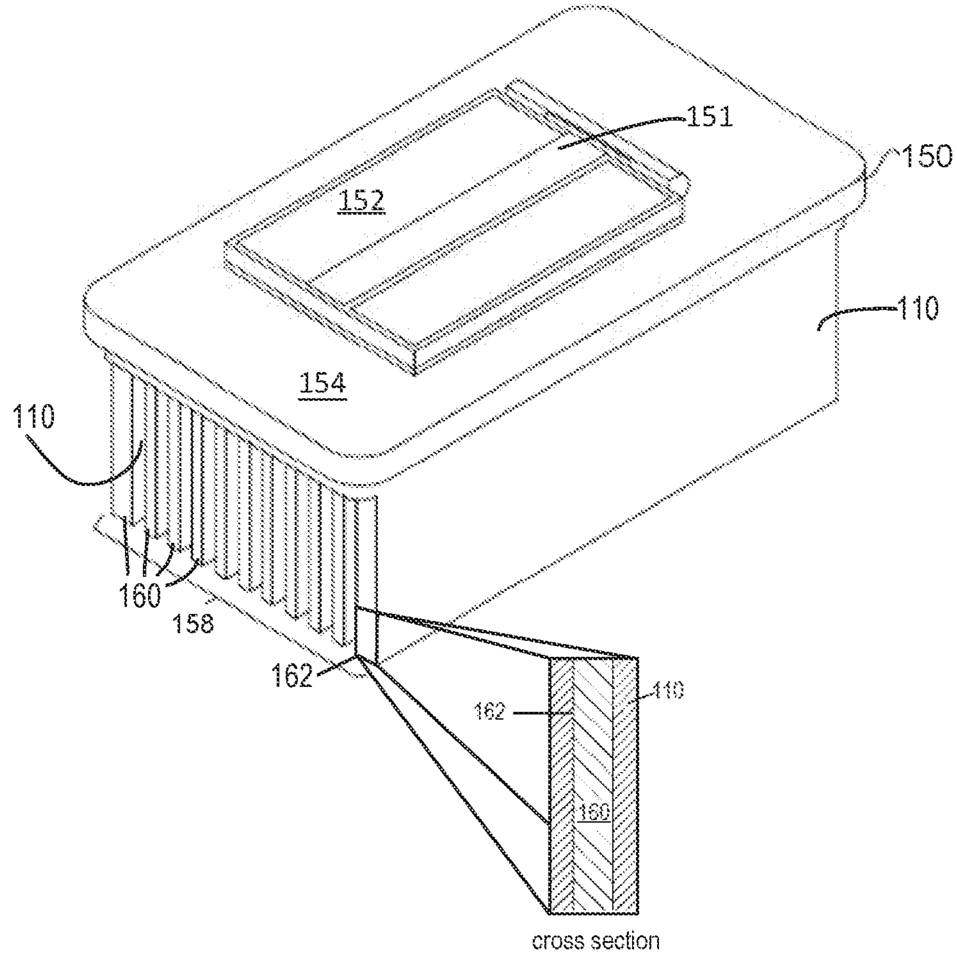
FIG. 1B illustrates an example of a laser diode assembly.

FIG. 1B illustrates an example of a laser diode assembly 150. Laser diode assembly 150 comprises a laser diode 151 configured to generate a laser beam. Laser diode 151 is coupled to submount 152 in a "Chip on Submount" (COS) assembly. Submount 152 may be made of a variety of materials such as SiC. Cu, aluminum nitride (AlN), diamond, graphene, or the like or any combinations thereof. Submount 152 is coupled to a heatsink 154 and configured to transfer heat generated by laser diode 151 to heatsink 154. Heatsink 154 may comprise any of a variety of thermally conductive materials such as aluminum silicon carbide (AlSiC), pyrolytic graphite, Cu, Al, or the like or any combinations thereof. Conductive lightweight materials such as Al may be preferred for low SWaP applications. Heatsink 154 includes a plurality of members 158 comprising fins 160. Members 158 can comprise any of a variety of structures having a high surface-to-volume ratio configured for efficient heat transfer. Such structures include fins, posts, pegs, textured surfaces (e.g., dimpled surfaces), structures constructed using additive manufacturing to optimize surface-to-volume ratios or the like or any combinations thereof (see, for example, FIGS. 3A-8B). All or a portion of surface 162 (shown in cross section) of members 158 may be coated with an anti-corrosive material 110 to prevent galvanic and/or abrasive corrosion, for example, where highly conductive, lightweight materials are used to enable liquid cooling in low SWaP applications. Heatsink 154 may be fabricated by a variety of techniques known to those of skill in the art such as computer numerical control (CNC) machining, casting, metal injection molding, sintering, skiving or micro-skiving, or 3D manufacturing, or the like or any combinations thereof.

Figure 1C:
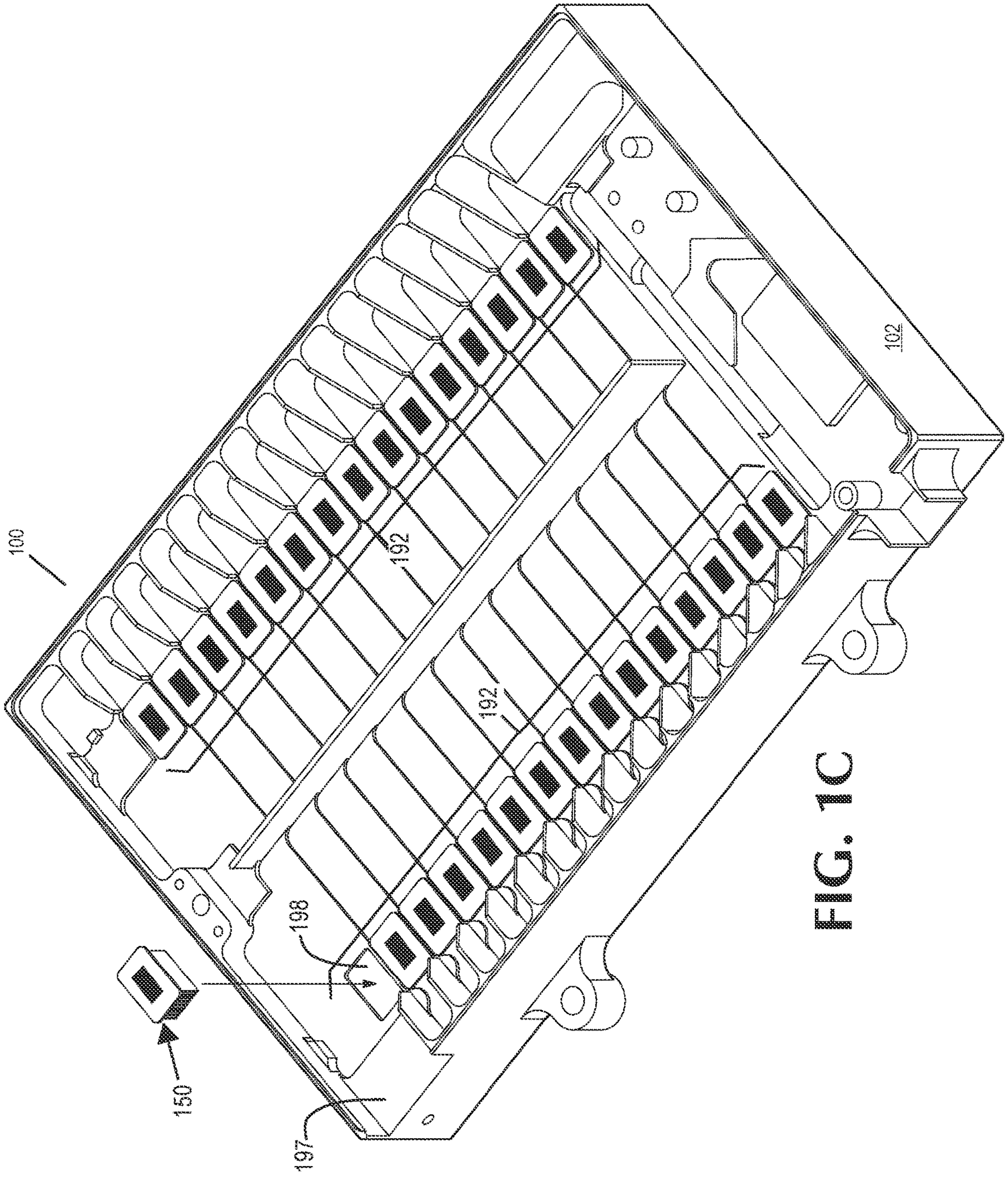
FIG. 1C illustrates a perspective view of an example liquid-cooled laser diode housing.

FIG. 1C illustrates a perspective view of top side 197 of an example liquid-cooled laser diode housing 100. A plurality of laser diode assemblies 150 form laser diode array 192. In an example, one or more laser diode assemblies 150 are mated to base 102 by inserting respective assemblies 150 into apertures 198 in the top side of base 102.

Figure 1D:
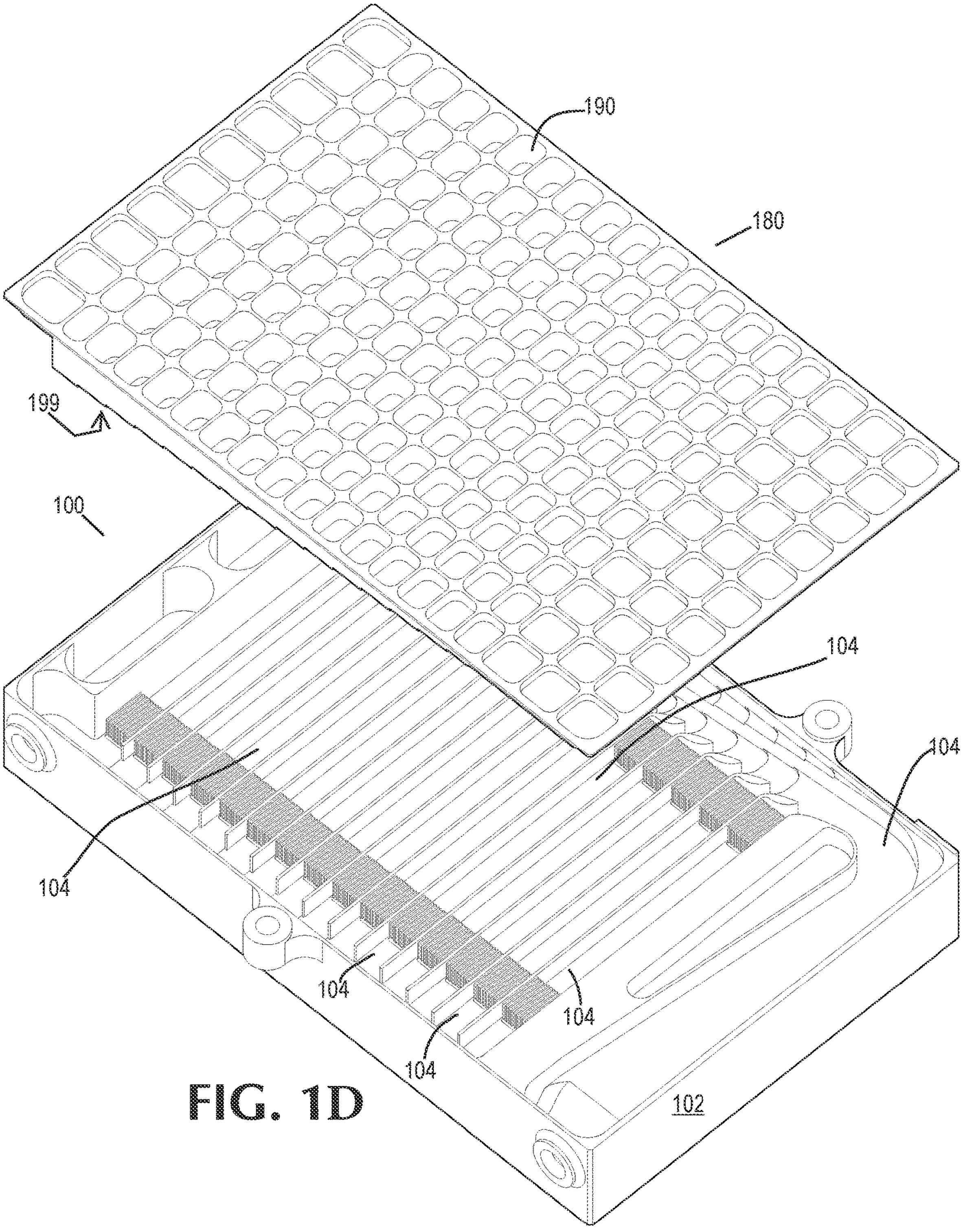
FIG. 1D illustrates an exploded view of an example liquid-cooled laser diode housing.

FIG. 1D illustrates an exploded view of an example liquid-cooled laser diode housing 100. Lid 180 is formed to couple to base portion 102 in order to make a liquid-tight seal with base portion 102 over channels 104 to prevent leaking of the liquid coolant onto fragile components and to maintain pressure inside channels 104.

Lid 180 and/or base portion 102 may comprise any of a variety of thermally conductive materials such as, Al, Cu, Ag, Au, Pt, doped Si, graphite or the like or any combinations thereof. For low size, weight, high-power ("low SWaP") packaging, highly thermally conductive Al may be preferred over higher density materials and can be used to decrease the overall weight of the housing 100. In an example, all or a portion of the surface that comes into contact with liquid coolant, wetted surface 199 of lid 180, may be coated with an anti-corrosive material 110.

Channels 104 in base portion 102 and cavities 190 may be machined into lid 180 to further reduce the weight of housing 100. Lid 180 and/or base portion 102 may include other weight reduction structures such as pores, honeycomb structures, holes, or the like or any combination thereof. Housing 100 may be formed by a variety of methods known to those of skill in the art such as by machining, etching, or 3D manufacturing, casting, or the like or any combination thereof.

Figure 1E:
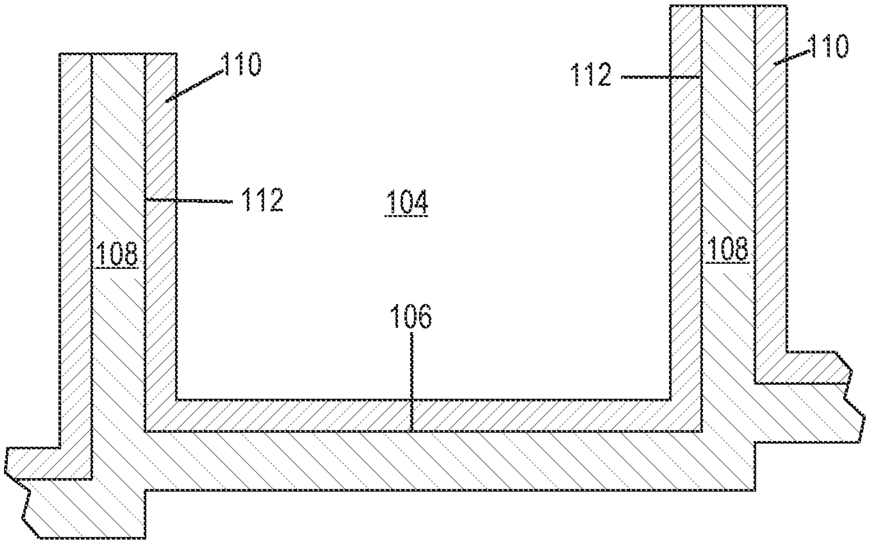
FIG. 1E illustrates a cutaway view of an example embedded cooling channel formed in a liquid-cooled laser diode housing.

FIG. 1E illustrates a cross-sectional view (section 1E-1E, FIG. 1A) of an anti-corrosive coating 110 applied to surfaces of a channel 104 in a liquid-cooled laser diode housing. Coating material 110 may be applied to all or a portion of surfaces 106 and 112. Coating 110 may be any of a variety of thicknesses, in some embodiments the range is about 0.5 micron to 30.0 micron. Because thermal conductivity of the surface coating impacts the thermal resistance for heat transfer through the surface based on the inherent thermal conductivity of the coating material and/or the base material, the coating material thickness and geometry, the surface coating can either slightly degrade the overall thermal transfer characteristics of the mechanical structure, or enhance the thermal performance of the system. For example, in some cases the coating 110 can cause a decrease in thermal performance but may add reliability and in the other cases it can enhance the thermal performance. Thickness of a low conductivity material may be suitable when thin; thickness of highly conductive material may be suitable when it is thick. The material, thickness and geometry for coating 110 may be selected so that the presence of coating 110 does not change the thermal resistance of the coated portions of base portion 102 by more than about 0-25%. For example, percent changes in the thermal resistance of the base portion 102 may range from 0%-20%, 0%-10%, 0-5%, 0-2% or 0-1% with lower percent changes being preferred for some examples. The anti-corrosive material of coating 110 may be SiC or DLC coatings. Using an anti-corrosive material like SiC or DLC can reduce corrosion without a significant penalty to the thermal conductivity of base portion 102.

DLC is an amorphous carbon material that retains some of the properties of diamond and graphite such as the ability to resist abrasive wear due to a hardness in the range of about 1000~8000 (Hv) and high thermal conductivity in the range of about 100-150 (W/m/K). DLC may be applied as a coating (DLCC) to other materials that could benefit from some of those properties. DLCC may be applied by passivation techniques using chemical or physical vapor deposition (CVD and PVD) methods. DLCC films can be conformally coated onto metal surfaces to provide a corrosion resistant passivation layer. Using DLCC, liquid-cooled laser housings can be manufactured with corrosion resistant, high thermal conductivity passivation layers which enable the use of light weight and low-cost Al in high reliability military and commercial applications. Moreover, DLCC has several benefits when compared to chemical plating schemes. For example, adhesion to the metal surfaces is better with DLCC than that of plated materials; the thermal performance of DLCC is significantly better than that of plated surfaces; corrosion resistance of DLCC is better than that of plated surfaces; and the complexity of applying DLCC is lower than that of utilizing the several plating layers that are required to successfully use a chemical plating scheme. DLCC deposition would occur in the regions that are exposed to liquid coolant such as inner surfaces of channels 104 and outer surfaces of heatsink fins 160 or other heat dissipation structures. The entire liquid-cooling channel 104 could be coated to reduce corrosion without impacting thermal performance. SiC has similar properties to DLC such as high thermal conductivity in the range of about 100-200 (W/m/K) and may also be used as an anticorrosive coating 110 without a substantial thermal conductivity penalty. Anti-corrosive materials that may be used as coating 110 in addition to DLC and SiC include boron carbide (B4C), aluminum nitride (AlN), cubic boron nitride (c-BN), hex boron nitride (h-BN), silicon nitride (Si3N4), or the like or any combinations thereof. If coating 110 comprises low conductivity materials, coating may have to be thin in order to prevent increasing the resistance level of the base beyond a predetermined acceptance level. If the coating 110 material is higher in conductivity than the base metal, making the coating 110 as thick as possible may be beneficial.

Figure 2A:
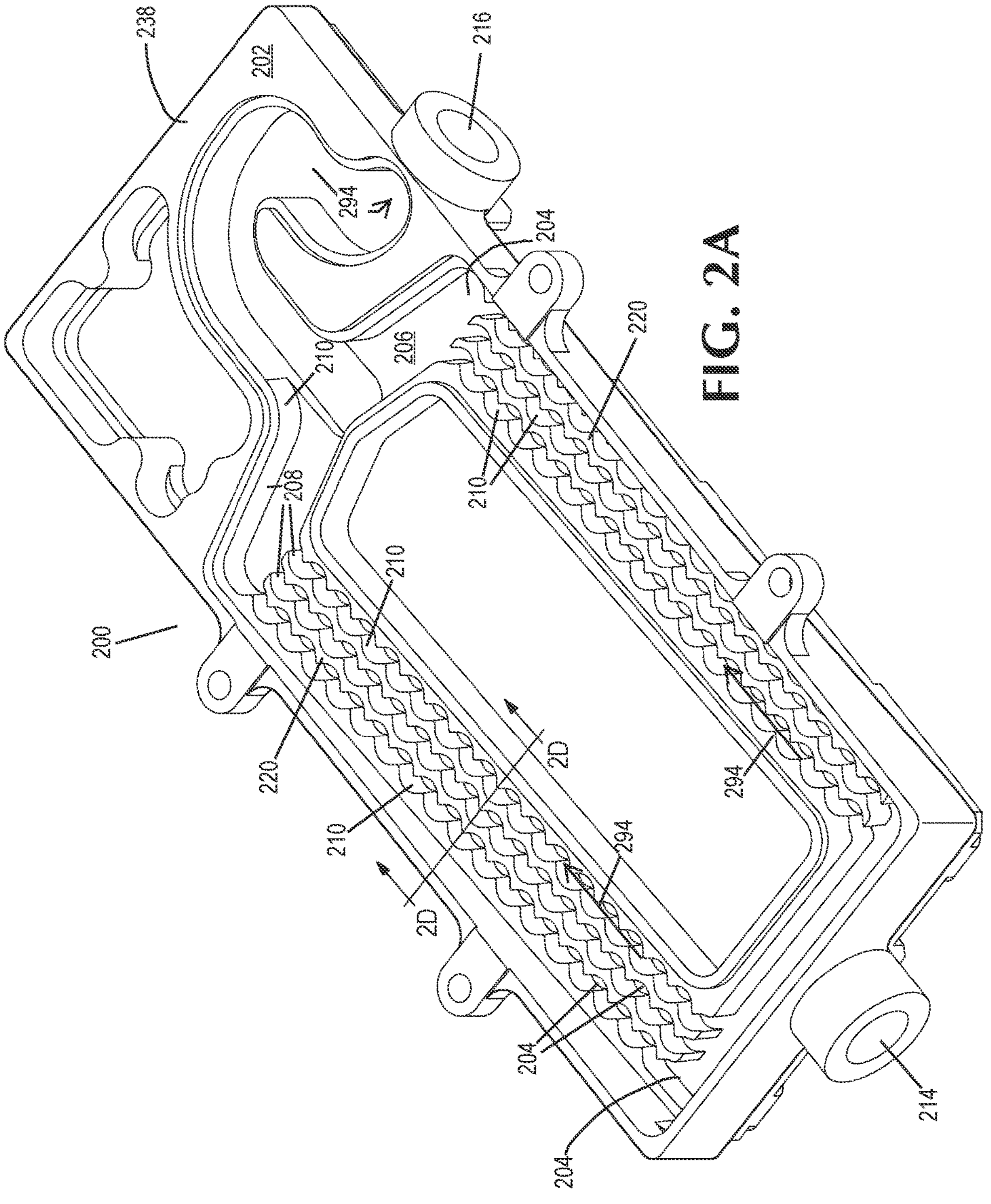
FIG. 2A illustrates a perspective view of cooling channels on a bottom side of an example heat source package comprising a liquid-cooled laser diode housing.

FIG. 2A illustrates a perspective view of an example liquid-cooled laser diode housing 200 which is an example of a package for cooling a heat source. Housing 200 comprises channels 204 and fins 220 machined into a bottom side 238 of a base portion 202. Channels 204 and fins 220 include a bottom surface 206 and one or more side walls 208 that are generally perpendicular to bottom surface 206. Channels 204 and fins 220 together conduct liquid in the direction of arrows 294 from inlet 214 to outlet 216.

As discussed above, base 202 may be made of a lightweight metal such as Al that is more susceptible to galvanic metal corrosion than other thermally conductive metals. Channels 204 and/or fins 220 are coated with an anti-corrosive coating 210. Coating 210 is selected to decrease galvanic corrosion in channels 204 and of fins 220 so as to extend the life of liquid-cooled laser diode housing 200. Coating 210 may also protect against abrasive, bacterial. pH related, erosive, and other types of corrosion. Coating 210 may be DLC, SiC. B4C, AlN, c-BN, h-BN, Si3N4, or the like or any combinations thereof.

Figure 2B:
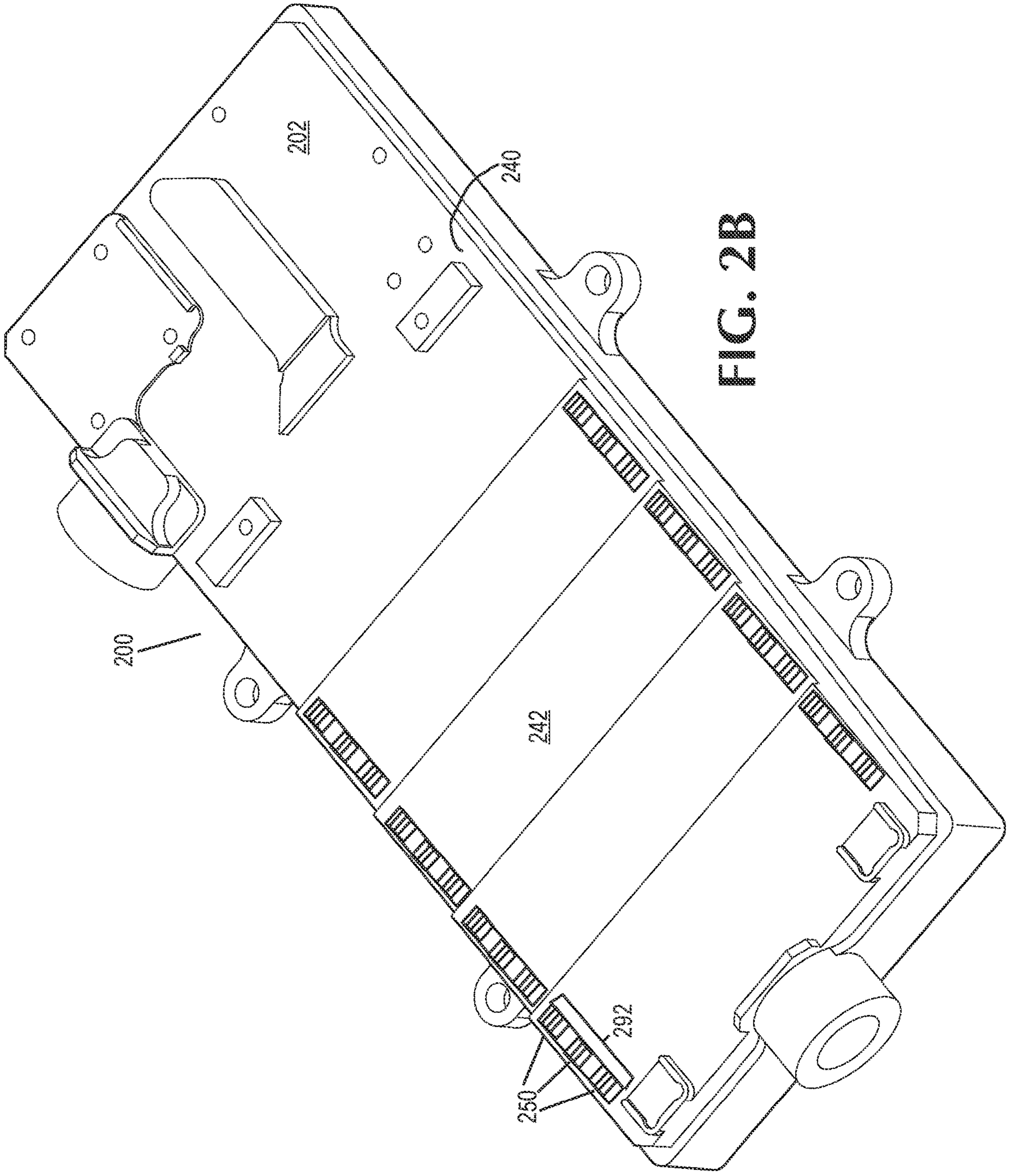
FIG. 2B illustrates a perspective view of a top side of an example liquid-cooled laser diode housing.

A liquid coolant in channels 204 flows along anfractuous fins 220 to transfer heat away from laser diode assemblies 250 disposed on the top surface 240 of housing 200 through base 202 (see, FIG. 2B). The liquid coolant selected to flow in channels 204 may be any of a variety of liquid coolants known to those of skill in the art. Likewise, fins 220 may have any of a variety of shapes formed to increase surface-to-volume ratio for efficient heat transfer. Fins 220 may be machined or fabricated by other techniques known to those of skill in the art.

FIG. 2B illustrates a perspective view of a top side 240 of an example liquid-cooled laser diode housing 200. Top side 240 is opposite bottom side 238 shown in FIG. 2A. In an example, a plurality of laser diode arrays 292 comprising a plurality of laser diode assemblies 250 are disposed on a stepped surface 242 of base 202. The laser diode arrays 292 generate heat that is conducted through base 202 and dissipated by liquid-cooling through channels 204 and fins 220.

Figure 2C:
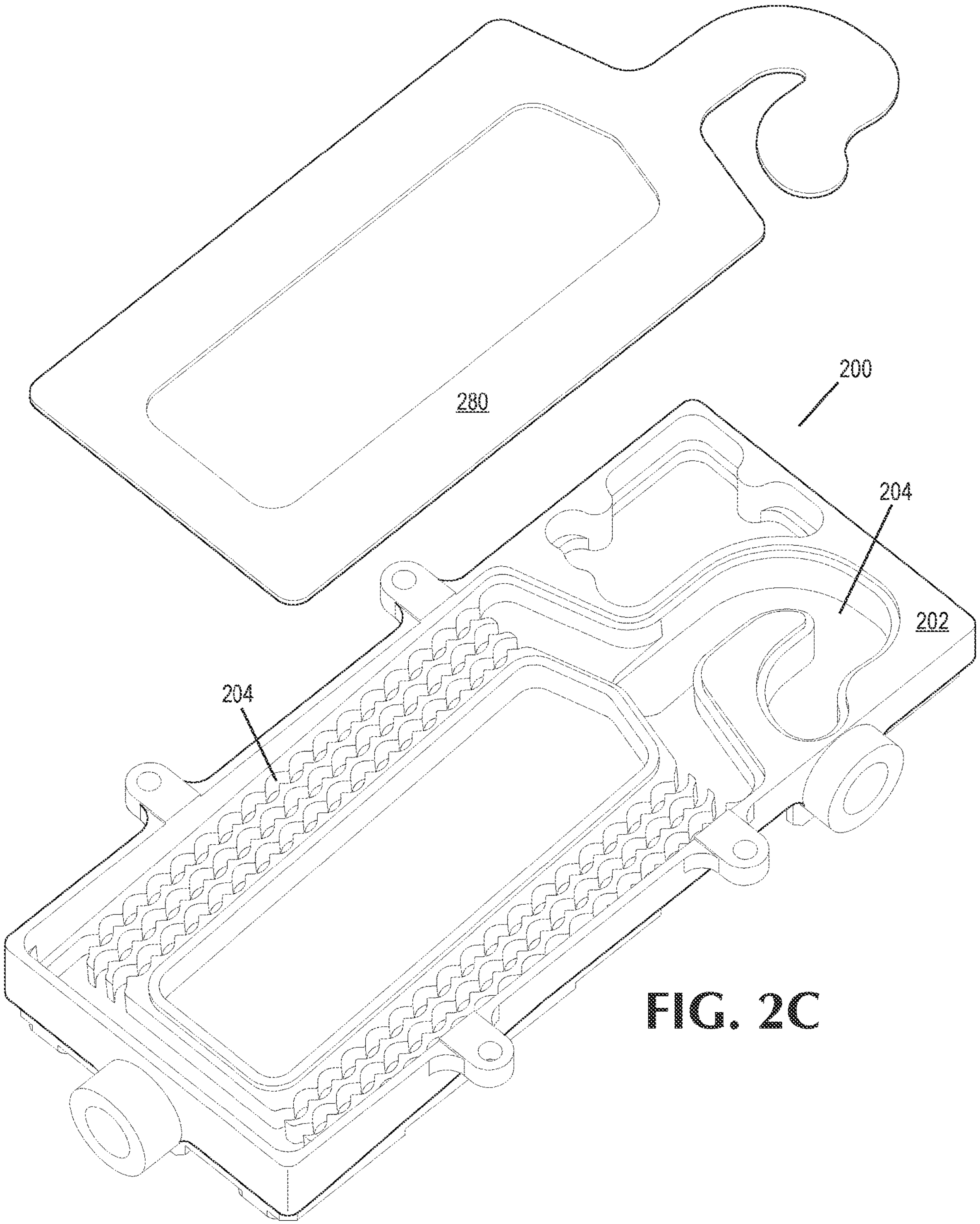
FIG. 2C illustrates an exploded view of an example liquid-cooled laser diode housing.

FIG. 2C illustrates an exploded view of an example liquid-cooled laser diode housing 200. The lid 280 is formed to couple to base portion 202 in order to make a liquid-tight seal with base portion 202 over channels 204 to prevent leaking of a liquid coolant and to maintain pressure inside channels 204. Lid 280 and/or base portion 202 may comprise any of a variety of thermally conductive materials. For low SWaP packaging, highly thermally conductive and lightweight materials such as Al may be preferred over higher density materials. A wetted inner surface of lid 280 may be coated with coating material 210.

Figure 2D:
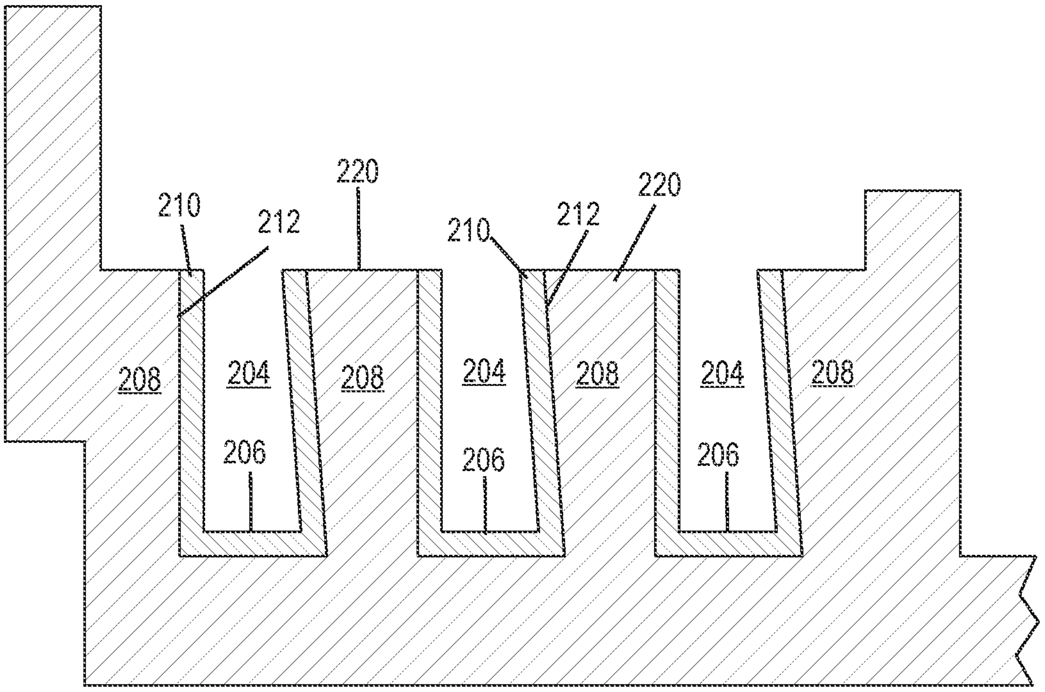
FIG. 2D illustrates a cutaway view of an embedded cooling channel on a bottom side of an example liquid-cooled laser diode housing.

FIG. 2D illustrates a cross-sectional view (section 2D-2D, FIG. 2A) of channels 204 and fins 220 in liquid-cooled laser diode housing 200. Coating material 210 is disposed on surfaces 206 and/or 212 of channels 204 ("coated portions"). Coating material 210 comprises an anti-corrosive substance like DLC, SiC, B4C, AlN, c-BN, h-BN, Si3N4, or the like or any combinations thereof. Coating material 210 may be of a variety of thicknesses from, for example, 0.05 micron to 30.0 micron. Coating material 210 may reduce corrosion of metal materials, from which channels 204 are formed without a significant thermal penalty. The material, thickness and geometry for coating 210 may be selected so that the presence of coating 210 does not change the thermal resistance of the coated portions 206 and 212 with respect to uncoated portions of base portion 202 by more than about 0-25%. For example, percent changes in the thermal resistance of the coated portions of base portion 202 may range from 0%-20%, 0%-10%, 0-5%, 0-2% or 0-1% with lower percent changes being preferred for some examples.

FIGS. 3A-8B illustrate perspective views of a variety of example heatsinks (354, 454, 554, 654, 754, and 854) that may be disposed in laser diode housing 100 as described above. Heatsinks (354, 454, 554, 654, 754, and 854) may have members (358, 458, 558, 658, 758, and 858) formed to increase a surface-to-volume ratio of heatsinks (354, 454, 554, 654, 754, and 854) for improved heat dissipation.

In some examples, members (358, 458, 558, 658, 758, and 858) are formed of thermally conductive materials (such as Al) that are susceptible to corrosion when exposed to liquid in a liquid-cooling environment. In such an environment, all or a portion of member surfaces (362, 462, 562, 662, 762, and 862) are coated with an anti-corrosive material (310, 410, 510, 610, 710, and 810). Moreover, pressures exerted on small, fragile features of members (358, 458, 558, 658, 758, and 858) by flowing liquid may cause mechanical strain and result in damage to or failure of the heatsink (354, 454, 554, 654, 754, and 854). As discussed above, DLC coatings have high thermal conductivity, high hardness level and low friction. Coating members (358, 458, 558, 658, 758, and 858) with anti-corrosive material coating (310, 410, 510, 610, 710, and 810) having high thermal conductivity, high hardness level and low friction ratings may improve their ability to withstand mechanical stress while remaining thermally conductive and preventing corrosion. Anti-corrosive material coating (310, 410, 510, 610, 710, and 810) may be about 0.05 micron to 30 microns thick.

Figure 3A:
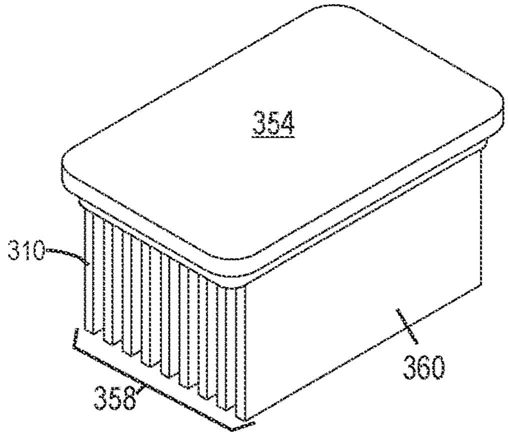
FIGS. 3A, 3B, 4A, 4B, 5A, 5B, 6A, 6B, 7A, 7B, 8A, 8B illustrate perspective views of a variety of example heatsinks having members for liquid cooling coated with an anti-corrosive material.
Figure 3B:
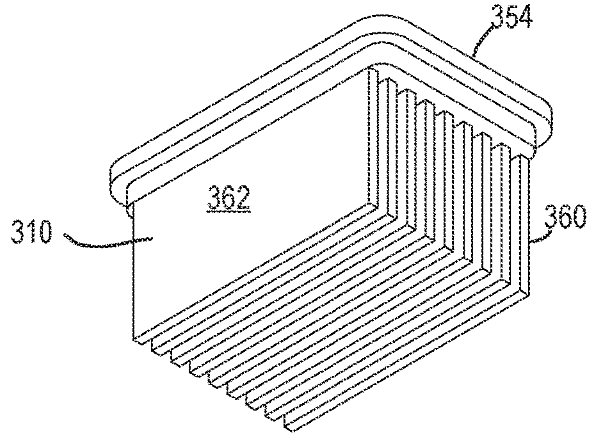

In FIGS. 3A-3B, heatsink 354 includes a plurality of members 358 comprising straight fins 360. Heatsink 354 has fewer fins 360 than heatsink 154 illustrated in FIG. 1B. The number of fins 360 may vary with packaging requirements. All or a portion of a surface 362 of fins 360 may be coated with an anti-corrosive material 310 such as DLC, SiC, B4C, AlN, c-BN, h-BN, Si3N4, or the like or any combinations thereof.

Figure 4A:
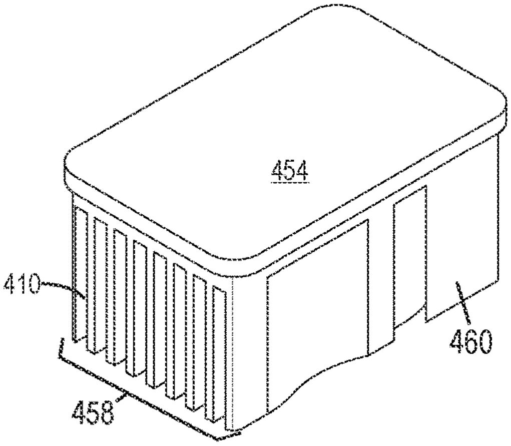
Figure 4B:
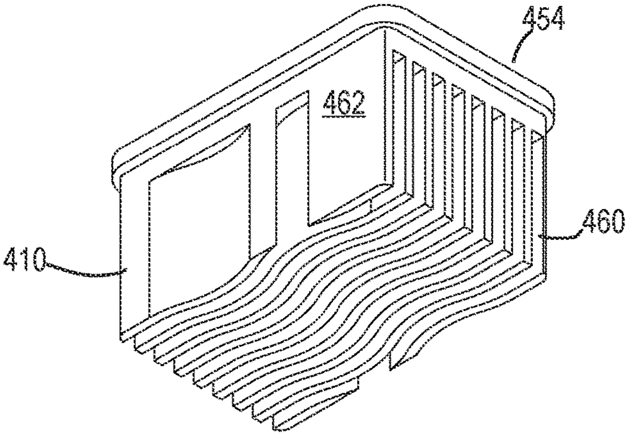

In FIGS. 4A-4B, heatsink 454 includes a plurality of members 458 comprising undulating fins 460. All or a portion of a surface 462 of fins 460 may be covered with an anti-corrosive coating 410 such as DLC, SiC, B4C, AlN, c-BN, h-BN, Si3N4, or the like or any combinations thereof.

Figure 5A:
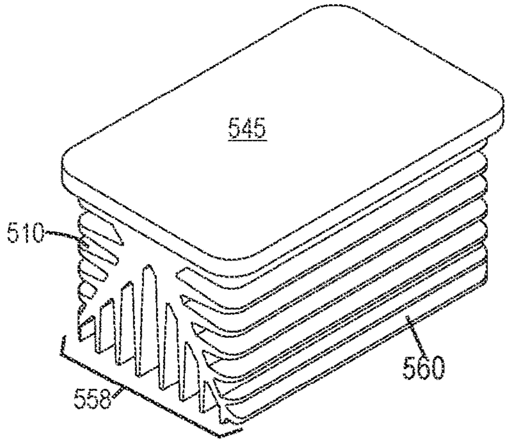
Figure 5B:
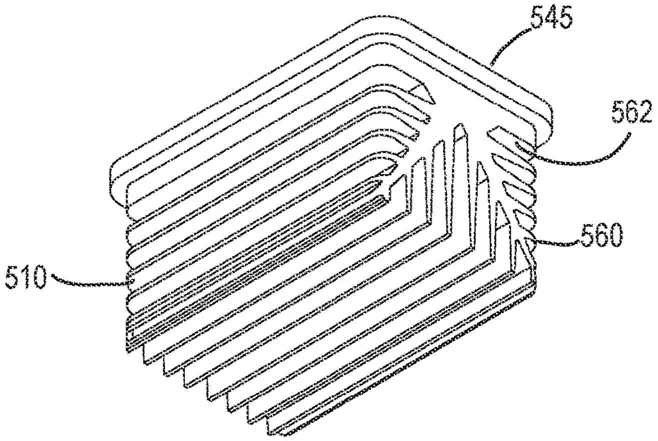

In FIGS. 5A-5B, heatsink 554 includes a plurality of members 558 comprising branched fins 560. All or a portion of a surface 562 of fins 560 may be covered with an anti-corrosive coating 510 such as DLC, SiC, B4C, AlN, c-BN, h-BN, Si3N4, or the like or any combinations thereof.

Figure 6A:
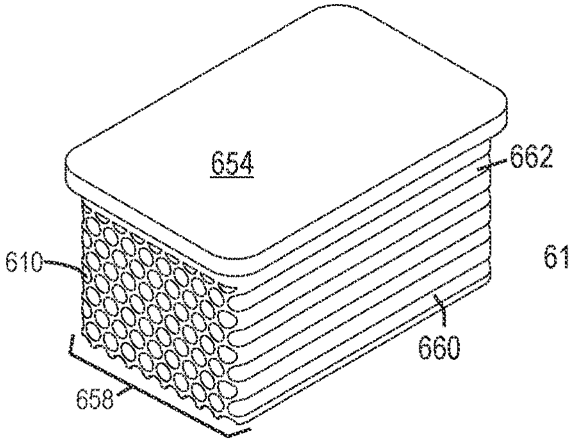
Figure 6B:
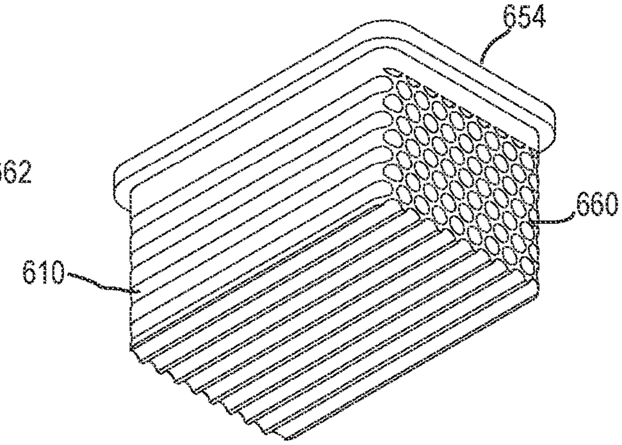

In FIGS. 6A-6B, heatsink 654 includes a plurality of members 658 comprising round micro-channels 660. All or a portion of inner surfaces 662 of channels 660 may be covered with an anti-corrosive coating 610 such as DLC, SiC, B4C, AlN, c-BN, h-BN, Si3N4, or the like or any combinations thereof.

Figure 7A:
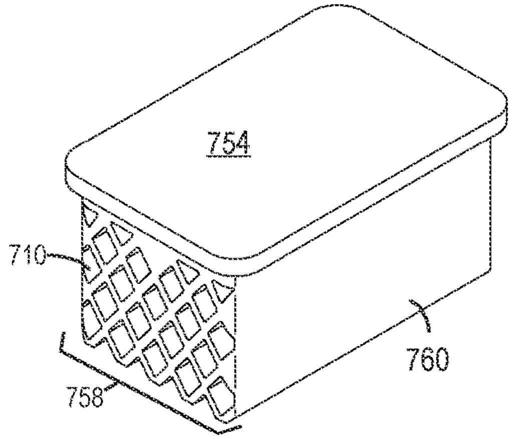
Figure 7B:
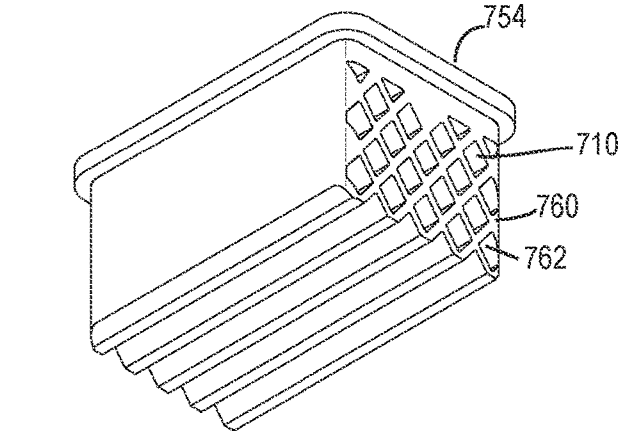

In FIGS. 7A-7B, heatsink 754 includes a plurality of members 758 comprising diamond shaped micro-channels 760. All or a portion of inner surfaces 762 of channels 760 may be covered with an anti-corrosive coating 710 such as DLC, SiC, B4C, AlN, c-BN, h-BN, Si3N4, or the like or any combinations thereof.

Figure 8A:
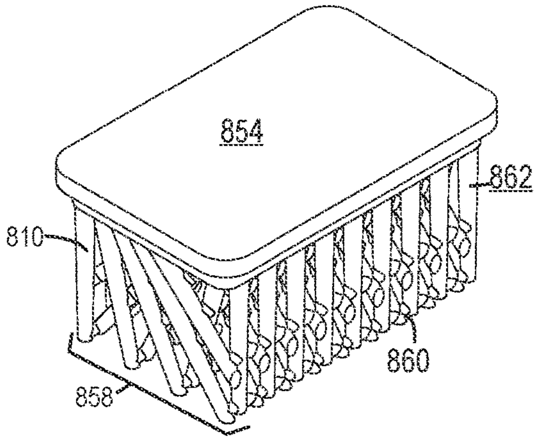
Figure 8B:
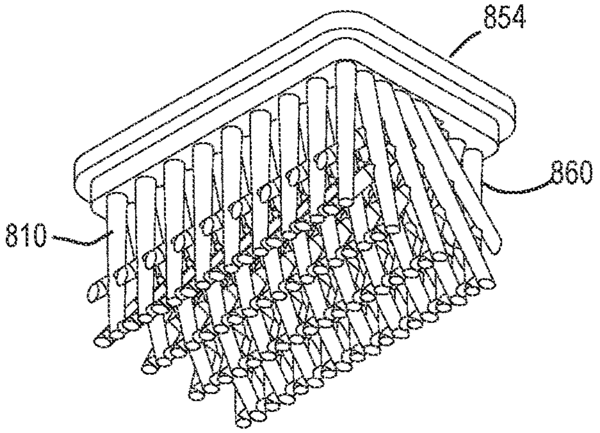

In FIGS. 8A-8B, heatsink 854 includes a plurality of members 858 comprising crossed pegs 860. All or a portion of surfaces 862 of pegs 860 may be covered with an anti-corrosive coating 810 such as DLC, SiC, B4C, AlN, c-BN, h-BN, Si3N4, or the like or any combinations thereof.

Having described and illustrated the general and specific principles of examples of the presently disclosed technology, it should be apparent that the examples may be modified in arrangement and detail without departing from such principles. We claim all modifications and variation coming within the spirit and scope of the following claims.

The invention claimed is:

1. A heat source package, comprising:

a housing having a metal base portion with one or more channels formed therein, the one or more channels having an inner surface formed of a bottom surface and one or more side wall surfaces;

a lid formed to couple to the metal base portion so as to form a liquid tight seal over the one or more channels;

a coating of an anti-corrosive material adhered to a portion of the inner surface of the one or more channels wherein the anti-corrosive material is selected to have a thermal conductivity, a thickness, and a geometry such that presence of the coating changes the thermal resistance for heat transfer of a coated portion of the inner surface less than 25% with respect to an uncoated portion of the metal base portion; and a heat source thermally coupled to the inner surface of the one or more channels, the one or more channels formed to conduct a liquid coolant from a liquid inlet to a liquid outlet to dissipate heat away from the heat source, wherein the coating is adhered to an inner surface of the lid, wherein the liquid coolant comprises water, glycol, ethylene glycol, diethylene glycol, propylene glycol, ammonia, 1,1,1,2-tetrafluoroethane, or any combinations thereof, wherein the metal base portion comprises Al, Cu, Ag, Au, Pt, doped Si, Mg, graphite or any combinations thereof, wherein the anti-corrosive material comprises DLC, SiC, $B_4C$, AlN, c-BN, h-BN, $Si_3N_4$, or any combinations thereof, and wherein the thickness of the coating is between about 0.05 micron to 30.0 micron.

2. The heat source package of claim 1, wherein the metal base portion comprises aluminum (Al) at least in part.

3. The heat source package of claim 1, wherein the anti-corrosive material is a diamond like carbon (DLC) or silicon carbide (SiC).

4. The heat source package of claim 3, wherein the DLC is adhered to the inner surface by a passivation technique.

5. The heat source package of claim 1, wherein the heat source is one or more laser diodes.

6. The heat source package of claim 5, wherein at least one of the one or more laser diodes is disposed on a heatsink comprising thermal dissipation members.

7. The heat source package of claim 6, wherein the heatsink is configured to mate to the metal base portion such that the thermal dissipation members extend into at least one of the one or more channels.

8. The heat source package of claim 7, wherein the thermal dissipation members are coated with an anti-corrosive material.

9. The heat source package of claim 8, wherein the coating is DLC.

10. The heat source package of claim 9, wherein the DLC is adhered to a surface of the thermal dissipation members by a passivation technique.

11. The heat source package of claim 1, further comprising one or more fins disposed in one or more of the channels.

12. The heat source package of claim 11, wherein the one or more fins comprise Al.

13. The heat source package of claim 11, wherein the one or more fins are anfractuous.

14. The heat source package of claim 11, wherein the coating is adhered to the one or more fins.

15. The heat source package of claim 11, wherein the heat source is one or more laser diode assemblies and wherein the one or more fins are each coupled through the metal base portion to the one or more laser diodes.

16. The heat source package of claim 1, wherein the anti-corrosive material is a DLC or SiC and wherein the liquid coolant is water.

17. The heat source package of claim 1, wherein the thermal conductivity threshold range of the coating changes the thermal resistance of the coated portion with respect to the un-coated portion within a range of 0%-20%, 0%-10%, 0-5%, 0-2% or 0-1%.

* * * * *